(12) United States Patent
Behringer et al.

(10) Patent No.: US 8,981,404 B2
(45) Date of Patent: Mar. 17, 2015

(54) OPTOELECTRONIC SEMICONDUCTOR CHIP AND A METHOD FOR THE PRODUCTION THEREOF

(75) Inventors: Martin Rudolf Behringer, Regensburg (DE); Christoph Klemp, Regensburg (DE); Christoph Rupprich, Maxhuette-Haidhof (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 101 days.

(21) Appl. No.: 13/825,296

(22) PCT Filed: Sep. 14, 2011

(86) PCT No.: PCT/EP2011/065950
§ 371 (c)(1),
(2), (4) Date: Oct. 2, 2013

(87) PCT Pub. No.: WO2012/038313
PCT Pub. Date: Mar. 29, 2012

(65) Prior Publication Data
US 2014/0014989 A1 Jan. 16, 2014

(30) Foreign Application Priority Data

Sep. 20, 2010 (DE) .......................... 10 2010 046 089

(51) Int. Cl.
*H01L 33/40* (2010.01)
*H01L 33/38* (2010.01)

(52) U.S. Cl.
CPC .............. *H01L 33/405* (2013.01); *H01L 33/38* (2013.01); *H01L 2224/48091* (2013.01); *H01L 2224/73265* (2013.01); *H01L 2224/32225* (2013.01); *H01L 2224/48227* (2013.01); *H01L 2924/01068* (2013.01)
USPC 257/98; 257/79; 257/E21.001; 257/E33.001; 438/22; 438/29

(58) Field of Classification Search
CPC ........ H01L 33/405; H01L 33/00; H01L 22/00
USPC .......... 257/79, 98, E21.001, E33.001; 438/22, 438/29
See application file for complete search history.

(56) References Cited

U.S. PATENT DOCUMENTS

| | | |
|---|---|---|
| 2004/0135166 A1 | 7/2004 | Yamada et al. |
| 2007/0221936 A1* | 9/2007 | Hahn et al. ...................... 257/98 |
| 2008/0185609 A1 | 8/2008 | Kozawa et al. |
| 2008/0218842 A1* | 9/2008 | Patel et al. .................... 359/291 |
| 2008/0237620 A1 | 10/2008 | Shiue et al. |
| 2009/0127567 A1* | 5/2009 | Wang ............................. 257/79 |
| 2010/0032699 A1 | 2/2010 | Lee |
| 2010/0065867 A1 | 3/2010 | Unno |

FOREIGN PATENT DOCUMENTS

| | | |
|---|---|---|
| EP | 1806790 A2 | 7/2007 |
| JP | 2008-124375 A | 5/2008 |

* cited by examiner

*Primary Examiner* — Fernando L Toledo
*Assistant Examiner* — Adam S Bowen
(74) *Attorney, Agent, or Firm* — Slater & Matsil, L.L.P.

(57) ABSTRACT

An optoelectronic semiconductor chip includes a semiconductor layer stack and a mirror. The semiconductor layer stack has an active layer for generating electromagnetic radiation. The minor is arranged on an underside of the semiconductor layer stack. The mirror has a first region and a second region, the first region containing silver and the second region containing gold. A method of producing such a semiconductor chip is also defined.

18 Claims, 1 Drawing Sheet

OPTOELECTRONIC SEMICONDUCTOR CHIP AND A METHOD FOR THE PRODUCTION THEREOF

This patent application is a national phase filing under section 371 of PCT/EP2011/065950, filed Sep. 14, 2011, which claims the priority of German patent application 10 2010 046 089.3, filed Sep. 20, 2010, each of which is incorporated herein by reference in its entirety.

TECHNICAL FIELD

The present invention relates to an optoelectronic semiconductor chip and a method for the production thereof.

BACKGROUND

U.S. Patent Publication No. 2010/0032699 A1 defines a light-emitting diode.

In conventional optoelectronic semiconductor chips, such as, for example, light-emitting diodes (LED), the output emitted by the component changes over its lifetime. For example, LEDs that emit radiation in the red wavelength range typically lose from 5 to 10% of their brightness during the first ten thousand hours of operation.

The term "lifetime" is used in particular to define the period during which the brightness of the emitted radiation of the semiconductor chip falls to a defined fraction of the initial value.

The change in output, especially the loss of output, during operation over the lifetime of the semiconductor chip is also known to the person skilled in the art as the ageing behavior. Ageing effects of such semiconductor chips are based, for example, on defects and imperfections in the semiconductor chip, especially on the density of the defects and the mobility thereof.

Such defects can occur in the crystal during growth or as a result of lattice mismatches between substrate and semiconductor layers, it being possible for the defects to spread out and migrate. In addition, defects may occur that diffuse into the semiconductor layers from the outside, for example, as a result of strains in other layers and assembly-related effects.

Such defects can arise inter alia at boundary faces in the semiconductor chip, such as, for example, between the carrier and the semiconductor layers, where there is a change in the lattice structure between the layers, where there is different doping in adjacent layers or at final semiconductor layers.

Such defects result inter alia in absorption of light, in a leakage current or in a change in or distortion of the lattice structure. This adverse action of the defects is exacerbated by high currents during operation of the semiconductor chips, a high operating temperature, a high photon density, and the like. In particular, the action is intensified by effects that increase the density and mobility. For example, as a result of such action the output over the lifetime of the semiconductor chips is reduced, with the result that disadvantageous ageing effects occur over the lifetime of the semiconductor chips.

SUMMARY OF THE INVENTION

Embodiments of the invention provide an optoelectronic semiconductor chip having improved output stability over its lifetime. A further problem of the invention is to define a method of producing such a semiconductor chip.

In a development there is provided an optoelectronic semiconductor chip having a semiconductor layer stack and a mirror. The semiconductor layer stack has an active layer for generating electromagnetic radiation. The mirror is arranged on an underside of the semiconductor layer stack and has a first and a second region. The first region contains silver (Ag). The second region contains gold (Au).

An optoelectronic semiconductor chip is especially a semiconductor chip that enables electrical energy to be converted into light emission, or vice versa. For example, the optoelectronic semiconductor chip is a radiation-emitting semiconductor chip.

The mirror is accordingly composed of two regions, the two regions differing in their material composition. In particular, the first region comprises a metal or a metal alloy, especially predominantly silver, and is accordingly in the form of a so-called silver mirror. The second region comprises a metal or a metal alloy, especially predominantly gold, and is accordingly in the form of a so-called gold mirror.

Accordingly, there is integrated in the semiconductor chip a gold mirror that is backed by a silver mirror. Alternatively, a reverse arrangement is possible, that is to say a silver mirror that is backed by a gold mirror.

In the case of the gold mirror that is backed by the silver mirror, the silver diffuses into the gold mirror during operation of the semiconductor chip and thus increases the reflectivity of the mirror over its lifetime. The reflectivity of the mirror accordingly increases during operation of the semiconductor chip; in particular an increase in reflectivity takes place over its lifetime. As a result of this integrated mirror in the chip, which mirror preferably does not have 100% reflectivity at the beginning and the reflectivity of which increases over the lifetime, it is possible to compensate for any ageing effects of the semiconductor chip that occur. In particular, it is possible to counter the decline in internal efficiency over the lifetime of the semiconductor chip, so that the output emitted by the semiconductor chip remains substantially constant. It is thus possible to realize a semiconductor chip having a stable output over the lifetime of the semiconductor chip.

In the case of the silver mirror that is backed by the gold mirror, the diffusion of the silver into the gold mirror leads to the opposite effect, so that it is possible to counter an increase in the output of the chip over the lifetime of the semiconductor chip.

The semiconductor layer stack has an attachment face with which the layer stack is arranged on the mirror. Furthermore, the semiconductor layer stack has a radiation exit face which is arranged opposite the attachment face and from which most of the radiation emitted by the semiconductor chip exits. The semiconductor chip is, for example, a surface-emitting chip.

The semiconductor chip preferably has a carrier on which the mirror and the semiconductor layer stack are arranged. The mirror is accordingly arranged between the carrier and the semiconductor layer stack. The carrier has on its side facing away from the semiconductor layer stack a mounting face with which the carrier can be arranged on, for example, a printed circuit board. For example, the carrier with the semiconductor chip is a surface-mountable component.

The printed circuit board has electrically conductive conductor tracks on its side facing the semiconductor chip. The semiconductor chip is in electrically conductive connection with the conductor tracks by means of electrical contacts. For example, two-sided contacting of the semiconductor chip is provided. In that case the semiconductor chip is arranged with the mounting face of the carrier on an electrical conductor track of the printed circuit board and makes electrical contact therewith. For example, the semiconductor chip is in electrically conductive connection with the electrical conductor track and/or is attached thereto by way of a connection layer, for example, an electrically conductive adhesive or a solder layer.

A contact region on the radiation exit face of the semiconductor chip is in electrically conductive connection with a further conductor track of the printed circuit board, for example, by means of a bonding wire which leads from the contact region of the semiconductor chip to a conductor track.

The electrical conductor tracks on the printed circuit board are arranged so as to be electrically insulated from one another, for example, by means of their being spaced apart from one another or by means of an electrically insulating layer.

Alternatively, the semiconductor chip can be electrically contacted from only one side, for example, by its attachment face. Such one-sided electrical contacting of a semiconductor chip and electrical leads connected thereto in the semiconductor layer stack, as, for example, in the case of flip-chips, are known to the person skilled in the art and are therefore not explained in detail here. In addition, the one-sided contacting can be effected on the side of the semiconductor chip facing away from the carrier, in which case the electrical contacting is effected by means of two bonding wires each leading from a contact region of the semiconductor chip to a conductor track.

The semiconductor layer stack has an active layer suitable for generating electromagnetic radiation. The active layer of the semiconductor layer stack preferably comprises a pn-junction, a double heterostructure, a single quantum well structure (SQW, single quantum well) or a multiple quantum well structure (MQW, multi quantum well) for generating radiation. The term quantum well structure does not have any significance here in respect of the dimensionality of the quantization. It therefore encompasses inter alia quantum troughs, quantum wires and quantum dots and any combination of those structures.

Preferably the semiconductor chip is a light-emitting diode (LED).

The semiconductor layer stack, especially the active layer, contains at least one III/V-semiconductor material, for example, a material comprising the material systems $In_xGa_yAl_{1-x-y}P$, $In_xGa_yAl_{1-x-y}N$ or $In_xGa_yAl_{1-x-y}As$, in each case where $0 \leq x$, $y \leq 1$ and $x+y \leq 1$. III/V-Semiconductor materials are especially suitable for generating radiation in the ultraviolet spectral range ($In_xGa_yAl_{1-x-y}N$), through the visible spectral range ($In_xGa_yAl_{1-x-y}N$, especially for blue to green radiation, or $In_xGa_yAl_{1-x-y}P$, especially for yellow to red radiation) to the infrared spectral range ($In_xGa_yAl_{1-x-y}As$).

In a development, the first region and the second region of the mirror are arranged vertically one on top of the other. The mirror accordingly has a layer stack of the first and second regions which are arranged perpendicular to the lateral extent of the carrier. In such an arrangement, the second region can be arranged between the semiconductor layer stack and the first region, the first region being directly adjacent to the carrier or being arranged thereon, or vice versa.

In a development, the first region and the second region of the mirror have different layer thicknesses, the first region preferably being thicker than the second region. For example, the thickness of the second region is at least 1.25 times or at least 1.5 times or at least 2.0 times greater and preferably also at most 5.0 times or at most 2.5 times greater than the thickness of the first region.

In a development, the layer thicknesses of the first region and the second region are matched to one another in such a way that it is possible to adjust a diffusion behavior of silver out of the first region into the second region during operation of the semiconductor chip.

Accordingly, the diffusion behavior of mirror material out of the first region into the second region is adjusted by way of the layer thicknesses of the regions of the mirror, the thicknesses of the regions of the mirror relative to one another being matched to one another so that a desired diffusion or a desired diffusion behavior occurs during operation of the semiconductor chip. As a result of the diffusion of silver out of the first region into the second region of the mirror, the reflectivity of the mirror changes over the lifetime. As a result, it is possible to counter a change in the output of the semiconductor chip, for example, a decline in output as a result of ageing effects, so that a semiconductor chip having a stable output over the lifetime can be realized. The ageing behavior of the semiconductor chip can thus be balanced out by diffusion in the mirror.

In a development, a diffusion barrier is arranged between the first region and the second region of the mirror. In that case the mirror has three components, a first region which contains predominantly silver, a second region which contains predominantly gold, and a diffusion barrier arranged therebetween.

In a development, the diffusion barrier reduces diffusion of mirror material between the first region and the second region. In particular, the diffusion barrier reduces diffusion of silver into the gold mirror, the rate of diffusion through the diffusion barrier being matched to the desired change in the reflectivity of the mirror during operation of the semiconductor chip over the lifetime thereof. As a result, the curve of the compensation of loss of output on the basis of the ageing effects that occur can be adjusted by means of the degree of barrier provided by the diffusion barrier.

In a development, the diffusion barrier prevents diffusion of mirror material between the first region and the second region, the diffusion barrier having apertures. In particular, the diffusion barrier entirely prevents diffusion of silver into the gold mirror.

In a development, the size and the distribution of the apertures in the diffusion barrier are such that the diffusion behavior of the diffusion barrier is adjustable, the diffusion behavior being adjusted in such a way that, during operation, a desired change in the reflectivity of the mirror is achieved over the lifetime of the semiconductor chip, so that, for example, the ageing effects of the semiconductor chip that occur can be compensated and thus a chip having a stable output is provided.

Apertures in the diffusion barrier are especially to be understood as being openings in the layer of the diffusion barrier so that, in some regions, direct contact can be made between the material of the first and second regions in the region of the openings in the diffusion barrier.

In accordance with at least one embodiment of the semiconductor chip, the openings or holes in the diffusion barrier have a diameter of at least 10 nm or at least 1 µm. Alternatively or in addition, the diameter is at most 1 µm or at most 50 µm.

In accordance with at least one embodiment, the proportion of holes or openings in the layer of the diffusion barrier is at least 5% and/or at most 30%. In other words, the layer then covers a proportion of the area of the mirror, seen in plan view, of at least 70% and/or at most 95%. The openings in the layer can be arranged regularly or can be randomly distributed. For example, the openings are produced by an etching process, especially a photolithographically based etching process, or by a stamping technique.

In accordance with at least one embodiment of the semiconductor chip, the layer of the diffusion barrier is formed with one or more of the following materials or consists of one or more of the mentioned materials: TiWN, ZnO, a silicon nitride, a silicon oxide, a metal such as Pt.

In accordance with at least one embodiment, the thickness of the layer of the diffusion barrier is at least 15 nm or at least 30 nm and/or at most 50 nm or at most 100 nm. If the layer is a continuous layer without openings, so that diffusion of silver into the second region containing gold takes place through a material of the layer, the thickness is preferably between 0.1 nm and 100 nm inclusive or between 0.5 nm and 15 nm inclusive. The material of the layer then is or comprises, for example, Pt or Ti, Ni, Pd.

In a development, one of the regions of the mirror can be structured. As a result of the structuring, the diffusion behavior can be adjusted in such a way that, during operation, a desired change in the reflectivity of the mirror is achieved over the lifetime of the semiconductor chip, so that a chip having a stable output can advantageously be produced.

Alternatively or in addition, an analogous effect can be achieved by means of the lateral extent of the individual regions of the mirror. For example, the first region has a greater lateral extent than the second region, or vice versa, the lateral extent of the individual regions being matched to the particular change in reflectivity that is desired, especially an increase or reduction, and the associated change in efficiency, especially an increase or reduction, over the lifetime of the chip.

In a development, the semiconductor chip is a thin-film LED. In the context of the application, a thin-film LED is considered to be an LED during the production of which the growth substrate on which the semiconductor layer stack was grown, for example, epitaxially, has been completely or partly detached.

In a development, the mirror has a reflectivity of less than 90%, the reflectivity advantageously increasing during operation of the semiconductor chip over the lifetime of the semiconductor chip.

In accordance with at least one embodiment, the first region, which preferably consists of silver or a silver alloy, has a thickness of at least 50 nm or of at least 30 nm. Furthermore, the thickness of the first region can be at most 500 nm or at most 100 nm.

In accordance with at least one embodiment, the second region, which preferably consists of gold or a gold alloy, has a thickness of at least 10 nm or of at least 50 nm. Alternatively or in addition, the thickness is at most 200 nm or at most 1 μm.

In at least one embodiment, the first region and the second region are, in places or over an entire major face of the regions, in direct physical contact with one another. In other words, in that case the silver of the first region touches the gold of the second region at least in some places.

In a method of producing an optoelectronic semiconductor chip having a carrier, a semiconductor layer stack and a mirror, the following method steps are used:
  preparation of the carrier,
  application of the mirror to the carrier, the mirror having a first region comprising silver and a second region comprising gold, and
  application of the semiconductor layer stack to the second region of the mirror.

Advantageous developments of the method are obtained analogously to the advantageous developments of the semiconductor chip and vice versa.

In a development, the reflectivity of the mirror is changed, for example, increased, during operation of the semiconductor chip over the lifetime thereof by diffusion of silver out of the first region into the second region. For example, the reflectivity of the mirror increases during operation, so that the ageing-related decline in the output of the semiconductor chip can be compensated, thus providing a semiconductor chip having a stable output.

In a development, the layer thicknesses of the first region and the second region are made such that the diffusion behavior of silver during operation of the semiconductor chip is adjusted, the layer thicknesses of the silver mirror and the gold mirror being matched to one another. In particular, the layer thicknesses are matched to one another in such a way that, as a result, the diffusion behavior of silver during operation of the semiconductor chip can be adjusted in such a way that a desired change in the reflectivity of the mirror takes place over the lifetime of the semiconductor chip.

In a development, the reflectivity of the mirror changes over the lifetime in such a way that the output of the semiconductor chip changes by less than 2% over its lifetime. For example, the ageing effects, especially the loss of output of the semiconductor chip over its lifetime, are compensated by the increase in the reflectivity of the mirror over the lifetime of the semiconductor chip, thus providing a semiconductor chip having a stable output which exhibits a variation in output of less than 2%.

In a development, prior to formation of the mirror, the curve of the ageing of the semiconductor chip is determined, the first region and the second region of the mirror being formed in such a way that the output curve determined is balanced out by changing the reflectivity of the mirror over the lifetime of the semiconductor chip.

"Balanced out" is to be understood in particular as meaning that the output is substantially or virtually unchanged over the lifetime of the semiconductor chip, that is to say any variations in the output that occur over the lifetime are very small, for example, are less than 2%.

Advantageously, first the curve of the normal output behavior of the semiconductor chip is determined and then the mirror, especially the first and second regions, is made in such a way that the determined output of the chip remains stable over its lifetime. For example, it is possible by means of the mirror to counter a decline in the output of the chip over its lifetime.

In a development, a diffusion barrier is arranged between the first region and the second region of the mirror, the diffusion barrier having apertures by means of the size and distribution of which the diffusion behavior during operation of the semiconductor chip is adjusted.

The diffusion barrier is accordingly opened at individual places or in some areas in order to enable intermixing of the material of the first and second regions to take place in those areas. The rate of diffusion in the openings is determined by way of the size and distribution of the openings. For example, the increase in the reflectivity of the mirror and, as a result, the curve of the compensation of loss of output is thus adjusted.

BRIEF DESCRIPTION OF THE DRAWINGS

Further features, advantages, developments and expedient features of the semiconductor chip and the method thereof will be found in the following exemplary embodiments explained below in conjunction with FIGS. 1 and 2, wherein.

Parts that are identical or have identical action are in each case denoted by identical reference numerals. The parts illustrated and the relative sizes of the parts to one another should not be regarded as to scale.

DETAILED DESCRIPTION OF ILLUSTRATIVE EMBODIMENTS

Figure 1A:
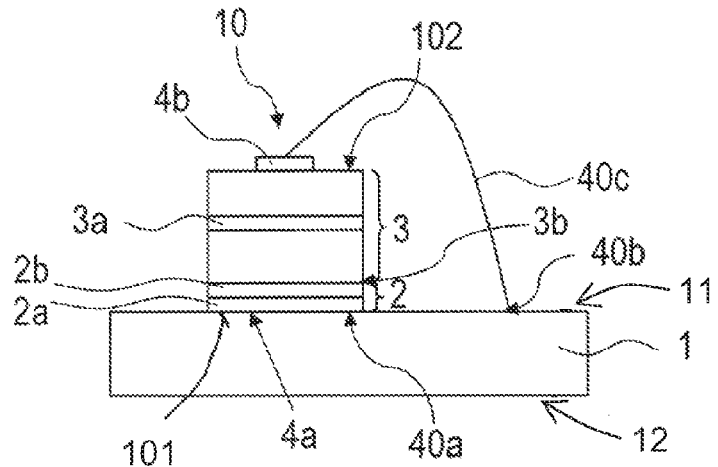
FIGS. 1A and 1B each show a diagrammatic cross-section through an exemplary embodiment of a semiconductor chip according to the invention.

FIG. 1 shows a semiconductor chip 10 which is arranged on a printed circuit board 1. A carrier (not shown) can be arranged between the semiconductor chip 10 and the printed circuit board. The semiconductor chip 10 is an optoelectronic semiconductor chip, especially a radiation-emitting semiconductor chip. In particular, the semiconductor chip 10 is a thin-film LED.

The printed circuit board 1 has an upper side 1 and an underside 12. On the upper side 1 there is arranged a semiconductor layer stack 3 of the semiconductor chip 10. The printed circuit board with the semiconductor chip 10 mounted thereon can be attached externally (not shown) by its underside 12.

On the upper side 1 there are arranged electrically conductive conductor tracks 40a, 40b. The electrical conductor tracks 40a, 40b are arranged so as to be electrically insulated from one another. For example, the electrical insulation is effected by means of their being spaced apart or by means of an electrically insulating layer. The electrical conductor tracks 40a, 40b serve for the electrical contacting of the semiconductor chip 10.

The semiconductor layer stack 3 is arranged by an attachment face 101 on one of the electrical conductor tracks 40a and is in electrically conductive connection therewith, for example, by way of an electrical contact 4a. For example, the semiconductor layer stack 3 is attached to the conductor track 40a by an electrically conductive connection layer, for example, an adhesive layer or a solder layer.

The semiconductor layer stack 3 has on a radiation exit face 102, which is located opposite the attachment face 101, a further electrical contact 4b. The further electrical contact 4b is in electrically conductive connection with a further conductor track 40b of the printed circuit board 1 by means of, for example, a bonding wire 40c.

The semiconductor layer stack 3 accordingly has two-sided contacting. Alternatively, the semiconductor layer stack 3 can have one-sided contacting, as provided, for example, in the case of flip-chips (not shown). One-sided contacting can be realized, for example, by means of two bonding wires or by means of two electrically conductive adhesive layers. Such chips are known to the person skilled in the art, however, and are therefore not explained in detail here.

The semiconductor chip 10 is a thin-film semiconductor chip. In particular, the growth substrate, on which the semiconductor layer stack 3 has been deposited, has been completely detached.

The semiconductor layer stack 3 has an active layer 3a for generating electromagnetic radiation. The electromagnetic radiation generated in the active layer 3a is coupled out of the semiconductor chip 10 predominantly at the radiation exit face 102 of the semiconductor chip 10. In this case the further electrical contact 4b of the semiconductor chip 10 is preferably transparent to the electromagnetic radiation generated by the active layer, for example, the further electrical contact 4b comprises TCO or ITO.

The semiconductor chip is preferably a surface-emitting semiconductor chip.

The semiconductor layer stack 3, especially the active layer 3a, comprises a III/V-semiconductor material. Preferably the semiconductor layer stack comprises $In_xGa_yAl_{1-x-y}P$. Preferably the semiconductor chip 1 emits radiation in the red wavelength range.

A mirror 2 is arranged between the semiconductor layer stack 3 and the printed circuit board 1. The mirror 2 has a first region 2a and a second region 2b. The first region 2a contains a metal or a metal alloy, preferably silver (Ag). The second region 2b contains a metal or a metal alloy, preferably gold (Au). In particular, the first region contains predominantly silver and the second region predominantly gold. The second region 2b has, for example, a thickness between 10 nm and 200 nm inclusive or between 50 nm and 200 nm inclusive and the first region has especially a thickness between 50 nm and 100 nm inclusive.

The first region 2a and the second region 2b are arranged vertically one on top of the other. The first region 2a and the second region 2b accordingly form a layer stack arranged perpendicular to the lateral extent of the printed circuit board 1. In the present exemplary embodiment, the second region 2b is arranged directly below the semiconductor layer stack 3, the second region 2b being backed by the first region 2a, that is to say the first region 2a is arranged on the side of the second region 2b opposite from the semiconductor layer stack 3. Alternatively, a reverse arrangement of the regions 2a, 2b of the mirror is possible, it thereby being possible to achieve a reverse technical effect.

In the present exemplary embodiment, during operation of the semiconductor chip 10 silver diffuses out of the first region 2a of the mirror 2 into the second region 2b of the mirror. As a result, the reflectivity of the mirror 2 advantageously increases over the lifetime of the semiconductor chip. By virtue of the increase in the reflectivity over the lifetime, any ageing behavior that occurs, which is reflected in particular in a decline in the output of the semiconductor chip over its lifetime, can be compensated. As a result of the compensation, the emitted output of the semiconductor chip 10 can thus be kept constant or virtually constant over the lifetime thereof. As a result, it is possible to achieve a semiconductor chip 10 that has a stable output over its lifetime.

The first region 2a and the second region 2b have different layer thicknesses. In particular, the layer thicknesses of the first region 2a and the second region 2b are matched to one another in such a way that diffusion of silver out of the first region 2a into the second region 2b during operation of the semiconductor chip 10 can be adjusted.

The reflectivity of the mirror 2 is influenced, especially increased, by means of the diffusion behavior of the silver from the first region 2a into the second region 2b. The reflectivity of the mirror 2 is accordingly determined by the diffusion behavior of the silver during operation of the semiconductor chip 10. The degree of diffusion of the silver can be adjusted by means of the layer thicknesses of the first region 2a and the second region 2b, the diffusion behavior in turn influencing the reflectivity of the mirror 2. In dependence upon the ageing behavior of the semiconductor chip 10, especially in dependence upon the decline in output over its lifetime, the diffusion behavior and accordingly the reflectivity can be adjusted by way of the layer thicknesses of the first region 2a and the second region 2b in such a way that the ageing-related decline in output of the semiconductor chip 10 is balanced out.

Semiconductor chips 10 having a mirror 2 so constructed exhibit a stable output over their lifetime. In particular, the change in the output over the lifetime of a semiconductor chip 10 so constructed is less than 2%, with the result that semiconductor chips having ageing stability, especially such semiconductor chips having ageing-stable emission of radiation, can be achieved.

Figure 1B:
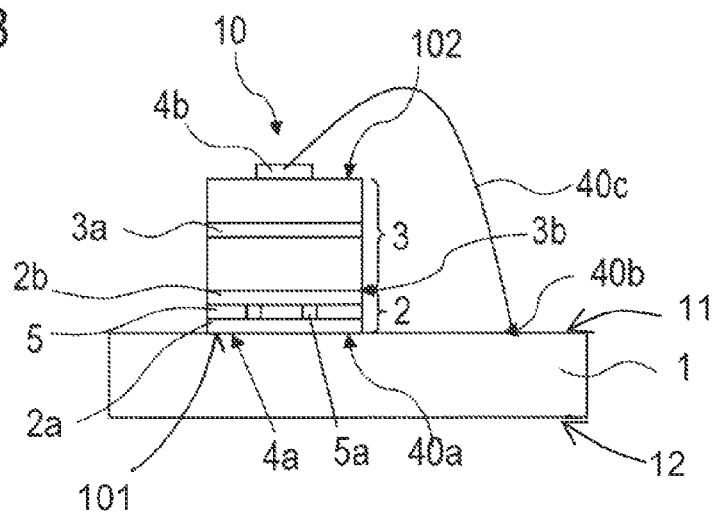

The exemplary embodiment of FIG. 1B differs from the exemplary embodiment of FIG. 1A in that a diffusion barrier 5 is arranged between the first region 2a and the second region 2b. The diffusion barrier 5 is especially in the form of a layer. This layer has the property of slowing down or completely preventing migration of silver from the first region 2a into the second region 2b.

If the structure of the diffusion barrier is such that diffusion of the silver is completely prevented, the diffusion barrier has apertures or openings. It is thus possible for diffusion of silver out of the first region 2a into the second region 2b to take place in the region of the openings. The openings preferably have a diameter between 10 nm and 1 μm inclusive or between 1 μm or 50 μm inclusive.

The rate of diffusion can be adjusted by means of the size and the distribution of the apertures in the diffusion barrier. The larger the apertures and the more apertures are arranged in the diffusion barrier, the greater is the diffusion behavior of the silver out of the first region into the second region. The rate of diffusion can be used to determine the compensation curve of the loss of output, such as occurs as a result of the ageing behavior. In particular, the increase in the reflectivity of the mirror during operation can be adjusted by way of the rate of diffusion, so that the ageing-related fall in the output of the semiconductor chip 10 can be compensated, thus making it possible to obtain a semiconductor chip 10 having a stable output.

Alternatively, one of the regions 2a, 2b of the mirror can be structured or can have a lateral extent different from that of the other region (not shown). As a result, it is possible to achieve an effect analogous to that achieved with the diffusion barrier, especially the integrated apertures.

The exemplary embodiment of FIG. 1B otherwise corresponds to the exemplary embodiment of FIG. 1A.

Figure 2:
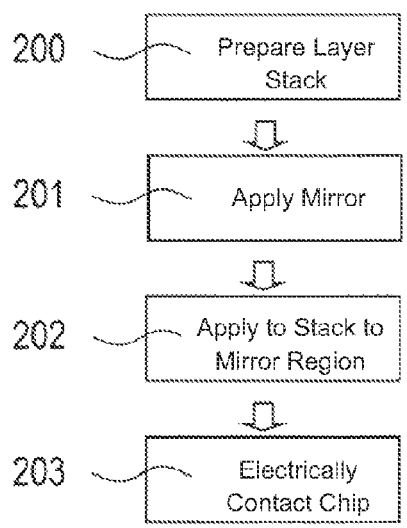
FIG. 2 is a flow diagram for the method of producing an exemplary embodiment of a semiconductor chip according to the invention.

FIG. 2 shows a flow diagram for a method of producing a semiconductor chip, for example, of the form shown in FIGS. 1A and 1B.

In method step 200, a semiconductor layer stack is prepared which has an active layer suitable for generating electromagnetic radiation. In addition, in method step 200 the ageing behavior of the semiconductor layer stack is determined. In particular, the curve of normal ageing of the semiconductor chip is determined.

In method step 201, a carrier is prepared to which a mirror is applied. The mirror is especially composed of a first region and a second region. The first region is a silver mirror and the second region is a gold mirror. The layer thicknesses of the mirrors are dependent upon the previously determined ageing behavior of the semiconductor chip 10. In particular, the layer thicknesses of the silver mirror and the gold mirror are matched to one another in such a way that the degree of diffusion during operation of the semiconductor chip is matched to the ageing behavior of the semiconductor chip. As a result of the diffusion of the silver out of the silver mirror into the gold mirror, the reflectivity of the mirror can change over the lifetime of the semiconductor chip, with the result that the ageing-related decline in output can be balanced out. The thicknesses of the regions of the mirror are such that the smallest possible variation in output occurs over the lifetime, the variation in output being especially less than 2% over the lifetime.

Optionally, a diffusion barrier can be arranged between the first region and the second region of the mirror. Such a barrier reduces, slows down or prevents intermixing of the silver in the gold mirror. If intermixing is prevented, apertures are formed in the diffusion barrier in order that diffusion of the silver out of the first region into the second region of the mirror can take place in those areas. The rate of diffusion can be adjusted by way of the size and distribution of the apertures, so that, depending upon the ageing behavior of the semiconductor chip, the reflectivity of the mirror can thus be increased.

In method step 202, the semiconductor layer stack is applied to the second region of the mirror. The semiconductor layer stack, especially the ageing behavior of the semiconductor layer stack, is optimally matched to the mirror on the carrier, especially by means of the layer thicknesses of the regions of the mirror and/or the optional diffusion barrier. In particular, the ageing-related decline in output over the lifetime of the semiconductor chip can be countered by the increasing reflectivity of the mirror over the lifetime of the semiconductor chip.

In method step 203, the semiconductor chip is electrically contacted and put into operation. During operation of the semiconductor chip, diffusion of silver out of the first region of the mirror into the second region of the mirror takes place, resulting in an increase in the reflectivity of the mirror 2. The ageing behavior of the semiconductor chip over the lifetime can accordingly be compensated, thus providing a semiconductor chip having a stable output.

The description of the invention with reference to exemplary embodiments does not limit the invention thereto, but rather the invention encompasses any novel feature and any combination of features, including in particular any combination of features in the patent claims, even if those features or those combinations are not themselves explicitly defined in the patent claims or exemplary embodiments.

The invention claimed is:

1. An optoelectronic semiconductor chip comprising:
   a semiconductor layer stack having an active layer for generating electromagnetic radiation; and
   a mirror arranged on an underside of the semiconductor layer stack, wherein the mirror has a first region containing Ag and a second region containing Au; and
   a diffusion barrier is arranged between the first region and the second region in direct contact with the first and second regions, wherein the diffusion barrier prevents diffusion of minor material between the first region and the second region and wherein the diffusion barrier has apertures.

2. The semiconductor chip according to claim 1, wherein the first region and the second region are arranged vertically one on top of the other and are in direct contact with one another at least in places, vertically meaning in a direction perpendicular to the underside.

3. The semiconductor chip according to claim 1, wherein the first region and the second region have different layer thicknesses.

4. The semiconductor chip according to claim 3, wherein the layer thicknesses of the first region and the second region are matched to one another in such a way that it is possible to adjust a diffusion behavior of Ag out of the first region into the second region during operation of the semiconductor chip.

5. The semiconductor chip according to claim 1, wherein the diffusion barrier reduces a diffusion behavior of mirror material between the first region and the second region, the diffusion barrier extending continuously between the regions.

6. The semiconductor chip according to claim 1, wherein the size and distribution of the apertures are such that the diffusion behavior of the diffusion barrier is adjustable.

7. The semiconductor chip according to claim 1, wherein the semiconductor chip is a thin-film LED.

8. A method of producing an optoelectronic semiconductor chip having a semiconductor layer stack and a mirror, the method comprising:
applying the mirror to a carrier, the minor having a first region comprising Ag and a second region comprising Au; and
applying the semiconductor layer stack to the second region of the mirror;
wherein a diffusion barrier is arranged between the first region and the second region in direct contact with the first and second regions, wherein the diffusion barrier prevents diffusion of minor material between the first region and the second region and wherein the diffusion barrier has apertures.

9. The method according to claim 8, wherein the reflectivity of the minor changes over the lifetime of the semiconductor chip in such a way that the output of the semiconductor chip changes by less than 2% over its lifetime.

10. The method according to claim 8, wherein the reflectivity of the minor changes, especially increases, over the lifetime of the semiconductor chip as a result of diffusion of Ag out of the first region into the second region.

11. The method according to claim 8, wherein the layer thicknesses of the first region and the second region are made such that the diffusion behavior of Ag during operation of the semiconductor chip is adjusted.

12. The method according to claim 8, wherein
prior to formation of the mirror the curve of the ageing of the semiconductor chip is determined, and
the first region and the second region of the mirror are formed in such a way that the ageing behavior is balanced out by increasing the reflectivity of the minor over the lifetime of the semiconductor chip.

13. The method according to claim 8, wherein a diffusion barrier is arranged between the first region and the second region, the diffusion barrier having apertures, the size and distribution of the diffusion behavior during operation of the semiconductor chip being adjusted by the apertures.

14. The semiconductor chip according to claim 2,
wherein the second region is arranged nearer to the semiconductor layer stack than the first region,
wherein silver from the first region diffuses into the gold of the second region during operation of the semiconductor chip and thus increases the reflectivity of the mirror over its lifetime,
wherein the first region has a thickness of at least 30 nm and of at most 100 nm,
wherein the second region has a thickness of at least 50 nm and of at most 200 nm.

15. The semiconductor chip according to claim 4,
wherein the second region is arranged nearer to the semiconductor layer stack than the first region,
wherein silver from the first region diffuses into the gold of the second region during operation of the semiconductor chip and thus increases the reflectivity of the mirror over its lifetime,
wherein the first region has a thickness of at least 30 nm and of at most 100 nm,
wherein the second region has a thickness of at least 50 nm and of at most 200 nm.

16. An optoelectronic semiconductor chip comprising:
a semiconductor layer stack; and
a mirror;
wherein the semiconductor layer stack has an active layer for generating electromagnetic radiation;
wherein the mirror is arranged on an underside of the semiconductor layer stack;
wherein the mirror has a first region and a second region;
wherein the first region contains Ag;
wherein the second region contains Au;
wherein a diffusion barrier is arranged between the first region and the second region, the diffusion barrier being in direct contact with the first and second regions;
wherein the diffusion barrier prevents diffusion of minor material between the first region and the second region; and
wherein the diffusion barrier has apertures.

17. The semiconductor chip according to claim 16,
wherein the apertures in the diffusion barrier are openings in the layer of the diffusion barrier so that, in some regions, direct contact is made between the material of the first and second regions in the region of the openings in the diffusion barrier, and
wherein the openings in the diffusion barrier have a diameter of at least 10 nm and at most 50μm.

18. The semiconductor chip according to claim 16,
wherein the diffusion barrier covers a proportion of the area of the mirror, seen in plan view, of at least 70%, the rest of the area is covered by the apertures, and
wherein the diffusion barrier is formed with one or more of the following materials: TiWN, ZnO, silicon nitride, silicon oxide, Pt.

* * * * *

UNITED STATES PATENT AND TRADEMARK OFFICE
CERTIFICATE OF CORRECTION

PATENT NO. : 8,981,404 B2
APPLICATION NO. : 13/825296
DATED : March 17, 2015
INVENTOR(S) : Martin Rudolf Behringer It is certified that error appears in the above-identified patent and that said Letters Patent is hereby corrected as shown below:

In the Claims,

In Col. 10, line 48, claim 1, delete "minor" and insert --mirror--.
In Col. 11, line 9, claim 8, delete "minor" and insert --mirror--.
In Col. 11, line 16, claim 8, delete "minor" and insert --mirror--.
In Col. 11, line 20, claim 9, delete "minor" and insert --mirror--.
In Col. 11, line 24, claim 10, delete "minor" and insert --mirror--.
In Col. 12, line 30, claim 16, delete "minor" and insert --mirror--.

Signed and Sealed this
Second Day of June, 2015

Michelle K. Lee
*Director of the United States Patent and Trademark Office*

UNITED STATES PATENT AND TRADEMARK OFFICE
CERTIFICATE OF CORRECTION

PATENT NO. : 8,981,404 B2
APPLICATION NO. : 13/825296
DATED : March 17, 2015
INVENTOR(S) : Martin Rudolf Behringer et al.

Page 1 of 1

It is certified that error appears in the above-identified patent and that said Letters Patent is hereby corrected as shown below:

In the Claims

In Col. 11, line 36, claim 12, delete "minor" and insert --mirror--.

Signed and Sealed this
Twenty-fifth Day of August, 2015

Michelle K. Lee
*Director of the United States Patent and Trademark Office*